(12) United States Patent
Pierreux et al.

(10) Patent No.: US 8,399,344 B2
(45) Date of Patent: Mar. 19, 2013

(54) METHOD FOR ADJUSTING THE THRESHOLD VOLTAGE OF A GATE STACK OF A PMOS DEVICE

(75) Inventors: Dieter Pierreux, Almere (NL); Vladimir Machkaoutsan, Almere (NL); Jan Willem Maes, Almere (NL)

(73) Assignee: ASM International N.V., Almere (NL)

( * ) Notice: Subject to any disclaimer, the term of this patent is extended or adjusted under 35 U.S.C. 154(b) by 10 days.

(21) Appl. No.: 12/898,911

(22) Filed: Oct. 6, 2010

(65) Prior Publication Data

US 2011/0081775 A1 Apr. 7, 2011

Related U.S. Application Data

(60) Provisional application No. 61/249,361, filed on Oct. 7, 2009.

(51) Int. Cl.
*H01L 21/28* (2006.01)
(52) U.S. Cl. ................... 438/591; 257/E21.177
(58) Field of Classification Search .................. None
See application file for complete search history.

(56) References Cited

U.S. PATENT DOCUMENTS

| | | | |
|---|---|---|---|
| 6,806,145 B2* | 10/2004 | Haukka et al. | 438/287 |
| 2009/0146216 A1* | 6/2009 | Nabatame et al. | 257/369 |
| 2010/0038729 A1* | 2/2010 | Eimori et al. | 257/411 |

* cited by examiner

*Primary Examiner* — Seahvosh Nikmanesh
(74) *Attorney, Agent, or Firm* — Preti Flaherty Believeau & Pachios LLP

(57) ABSTRACT

A method for fabricating a semiconductor device comprising a gate stack of a gate dielectric and a gate electrode, the method including forming a gate dielectric layer over a semiconductor substrate the gate dielectric layer being a metal oxide or semimetal oxide having a first electronegativity; forming a dielectric $V_T$ adjustment layer, the dielectric $V_T$ adjustment layer being a metal oxide or semimetal oxide having a second electronegativity; and forming a gate electrode over the gate dielectric layer and the $V_T$ adjustment layer; wherein the Effective Work Function of said gate stack is tuned to a desired value by tuning the thickness and composition of the dielectric $V_T$ adjustment layer and wherein the second electronegativity value is higher than both the first electronegativity value and the electronegativity of $Al_2O_3$.

9 Claims, 5 Drawing Sheets a)

b)

c)

Periodic table of electronegativity using the Pauling scale

See also Periodic table

Figure 1

| Element | Pauling electronegativity | Oxide $A_xB_y$ | Geometric mean electronegativity (Sanderson Criterion) $(A^xB^y)^{1/(x+y)}$ |
|---|---|---|---|
| Si | 1.9 | SiO2 | 2.82 |
| Hf | 1.3 | HfO2 | 2.49 |
| Al | 1.61 | Al2O3 | 2.54 |
| Ti | 1.54 | TiO2 | 2.63 |
| Pb | 2.33 | Pb2O3 | 2.94 |
| Mo | 2.16 | Mo2O3 | 2.86 |
| W | 2.36 | WO3 | 3.13 |
| Sb | 2.05 | Sb2O3 | 2.80 |
| Bi | 2.02 | Bi2O3 | 2.78 |
| Ge | 2.01 | GeO2 | 2.88 |
| Ni | 1.91 | NiO | 2.56 |
| Ga | 1.81 | Ga2O3 | 2.66 |
| V | 1.63 | V2O5 | 2.78 |
| O | 3.44 | | |

Figure 2

METHOD FOR ADJUSTING THE THRESHOLD VOLTAGE OF A GATE STACK OF A PMOS DEVICE

FIELD OF THE INVENTION

This invention relates to the field of gate stacks for semiconductor devices, in particular gate stacks having an adjustable threshold voltage.

BACKGROUND

A major challenge to make high-k metal oxides as gate dielectric successful in gate stacks for transistors is finding appropriate electrodes with stable band-edge Effective Work Functions (EWF) in order to meet the threshold voltage ($V_T$) specifications for a gate stack in silicon technology as defined by the International Roadmap for Semiconductors (ITRS). For NMOS transistors the EWF of the gate stack needs to be high (closer to the Si conduction band edge) and for PMOS stacks, the EWF needs to be low (closer to the Si valence band edge). For NMOS devices a gate dielectric is deposited over a p-type gate region of a semiconductor substrate. In the on-state of the NMOS transistor, an n-type conductive channel is formed in the p-type gate area, between the n-type source and drain regions. For PMOS devices a gate dielectric is formed over an n-type gate region. One of the techniques known in the art for adjusting the EWF of the gate stack is adjusting the composition of the metal electrode; see e.g. US Patent Application Publication 2004/0106261 and U.S. Pat. No. 6,846,734. The value of the EWF of a gate stack is influenced by the electronegativity of the different elements and compounds composing the gate stack. Adding elements or compounds, which are more electronegative/electropositive than the host high-k dielectric tends to shift the EWF in positive/negative direction respectively. More recently, capping of the gate dielectric by using ultra-thin dielectric cap layer has been used to tune the EWF of the gate stack towards the desired values, e.g. IEEE Electron. Dev. Lett. 28(6), 486-488 (2007); IEEE Transactions on Electron. Dev. 54(10) 2738-2749 (2007); ECS Transactions 11(7) 201-211 (2007); ECS Transactions 19(1) 253-261, (2009). Typically, La based dielectric caps are used for NMOS and Al based caps for PMOS. The VFB shift with $Al_2O_3$ capping layers is only about 200 mV and not meeting requirements for 32 nm High Performance (HP) PMOS logic transistors. When increasing the thickness of the $Al_2O_3$ film, the $V_T$ shift only hardly increases and, because of the low k value of the $Al_2O_3$ layer, the EOT penalty significantly increases, which is unacceptable. Alternative cap layers are desirable, in particular for PMOS devices.

SUMMARY OF THE INVENTION

It is an object of the invention to provide an improved method for manufacturing an integrated circuit comprising a gate stack of a gate dielectric and a gate electrode over a semiconductor substrate in which method the $V_T$ value of the gate stack can easily be adjusted.

According to an embodiment, a method is provided for fabricating a semiconductor device comprising a gate stack of a gate dielectric and a gate electrode, the method comprising the steps of: forming a gate dielectric layer over a semiconductor substrate the gate dielectric layer being a metal oxide or semimetal oxide having a first electronegativity value; forming a dielectric $V_T$ adjustment layer, the dielectric $V_T$ adjustment layer being a metal oxide or semimetal oxide having a second electronegativity; and forming a gate electrode over the gate dielectric layer and the $V_T$ adjustment layer; wherein the Effective Work Function of said gate stack is tuned to a desired value by tuning the thickness and composition of the dielectric $V_T$ adjustment layer and wherein the second electronegativity value is higher than both the first electronegativity value and the electronegativity of $Al_2O_3$. In a preferred embodiment the metal or semimetal of the $V_T$ adjustment layer is selected from one of the following five groups: Group 1: Ti; Group 2: Mo, W; Group 3: Pb; Group 4: Sb, Bi; Group 5: Ge. The $V_T$ adjustment layer can be provided under, over or midway the high-k gate dielectric layer.

According to another embodiment of the present invention, a method is provided for fabricating a semiconductor device comprising a gate stack of a gate dielectric and a gate electrode, the method comprising the steps of: forming a gate dielectric layer over a semiconductor substrate, the gate dielectric layer being a metal oxide or semimetal oxide wherein the metal or semimetal having a first electronegativity; doping the gate dielectric layer with a one or more dopant elements having a second electronegativity; and forming a gate electrode over the gate dielectric layer and the $V_T$ adjustment layer; wherein the Effective Work Function of said gate stack is tuned to a desired value by selecting the type and amount of dopant elements layer and wherein the second electronegativity is higher than the first electronegativity.

According to yet another embodiment of the present invention, a method is provided for fabricating a semiconductor device comprising a gate stack of a gate dielectric and a gate electrode, the method comprising the steps of: forming a gate dielectric layer over a semiconductor substrate; forming a dielectric $V_T$ adjustment layer containing Ge, Sb or Te in any composition thereof over the gate dielectric layer; and forming a gate electrode over the gate dielectric layer and the $V_T$ adjustment layer; wherein the Effective Work Function of said gate stack is tuned to a desired value by tuning the thickness and composition of said $V_T$ adjustment layer.

BRIEF DESCRIPTION OF THE FIGURES

FIG. 1 shows a periodic table of electronegativity values of the elements.

FIG. 2 shows electronegativity values of some elements and their oxides.

DETAILED DESCRIPTION OF THE INVENTION

Figure 3:
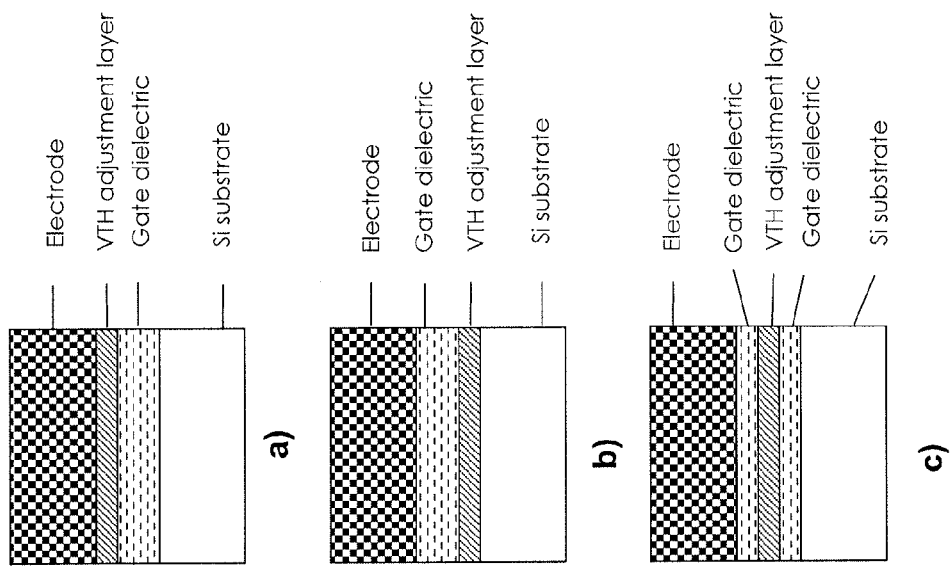
FIG. 3 shows possible positions in the gate stack of dielectric $V_T$ adjustment layers.

As a dielectric $V_T$ adjustment layer, metal oxides wherein the metal is selected from one of the following five groups can be used based on the electronegativity of the metals: Group 1: Ti; Group 2: Mo, W; Group 3: Pb; Group 4: Sb, Bi; Group 5: Ge; FIG. 1 shows a periodic table of the elements giving the electronegativity of the respective elements. For a compound $A_xB_y$ the electronegativity of the compound $EN(A_xB_y)$ can be calculated based on the electronegativity of the composing elements $EN(A)$ and $EN(B)$ according to the Sanderson Criterion: $EN(A_xB_y)=(EN(A)^x \cdot EN(B)^y)^{1/(x+y)}$. The values for a selected number of elements and their oxides are shown in FIG. 2, see also ECS Transactions 19(1) 253-261, (2009). The position of the $V_T$ adjustment layer can be selected below, midway or above the high-k gate dielectric layer as shown in FIG. 3.

Instead of using a dielectric $V_T$ adjustment layer of a metal oxide, also doping of the high-k gate dielectric can be used. Preferably the top of the gate dielectric layer is doped with one or more elements having a high electronegative value. Alternatively the interface between the Si substrate and the gate dielectric layer can be doped with one or more elements having a high electronegative value. In particular Fluorine is suitable for this purpose as it has an extremely high electronegative value and in general fluorine is compatible with semiconductor processing. Suitable precursors for fluorine doping are F2, NF3, TiF4 and TaF5. Other halides can also be used.

Finally, adding a layer containing Ge, Sb or Te (GST) in any composition thereof to the gate electrode metal is contemplated. Such a layer is beneficial because all three of its components have high electronegativity and are suitable for ALD deposition. The GST adjustment layer is preferably deposited directly on top of the gate dielectric layer.

Example 1

Figure 4:
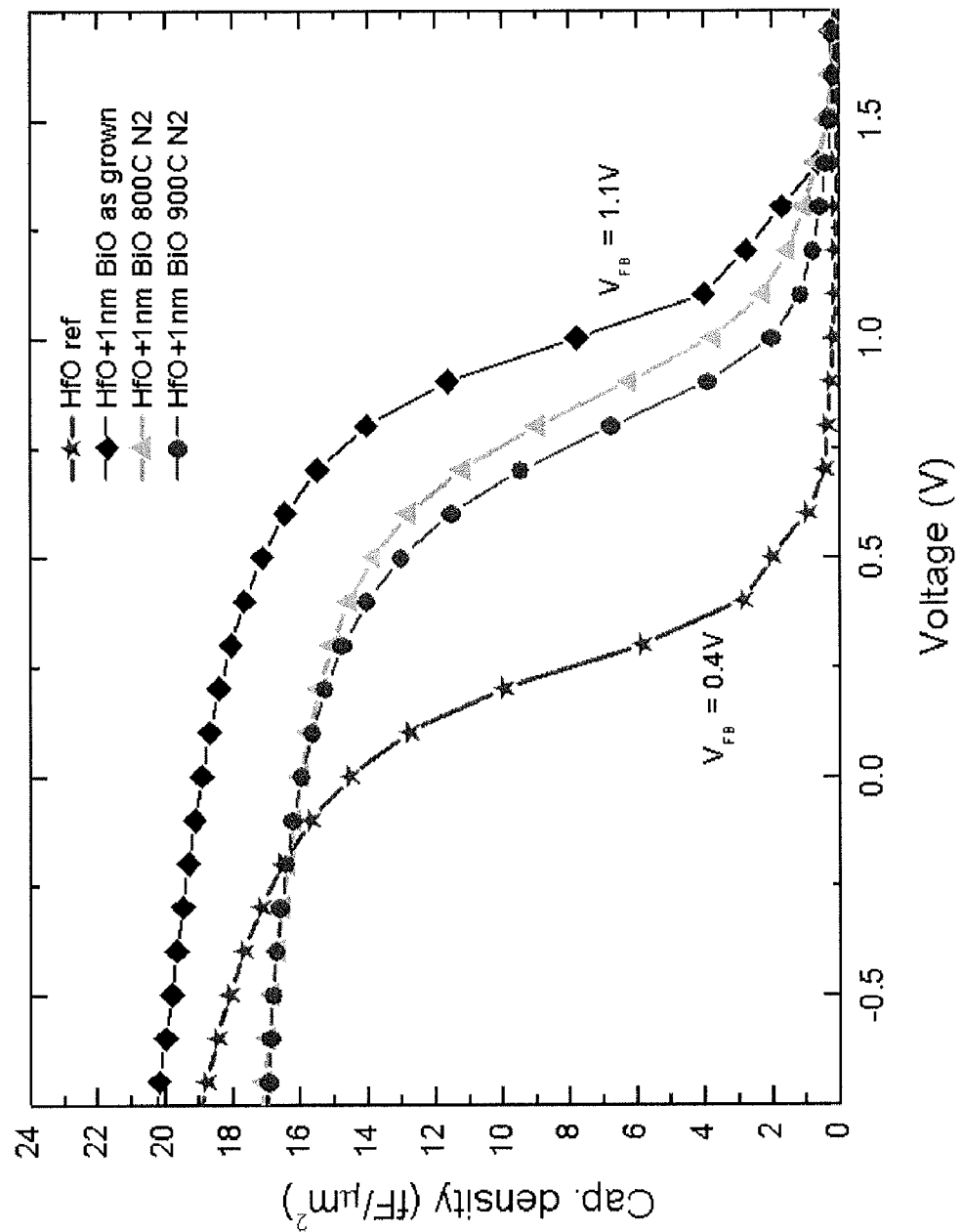
FIG. 4 shows CV curves for gate stacks having a $Bi_2O_3$ $V_T$ adjustment layer.

On p-type silicon substrates first a ~1 nm $SiO_2$ interfacial layer was grown and then a 2 nm $HfO_2$ high-k gate dielectric layer was deposited with an ALD process using $HfCl_4$ and $H_2O$ chemistry. A 1 nm $Bi_2O_3$ $V_T$ adjustment layer was deposited over the $HfO_2$ gate dielectric using an ALD process and $Bi(dmb)_3+H_2O$ chemistry as described in US Patent Publication No. 2007-148347 by Hatanpää et al. which is incorporated herein by reference. Anneals at 800 and 900° C. in N2 for 10 minutes were performed. A top electrode of Pt was deposited by Physical Vapor Deposition. C-V curves for a $HfO_2$ reference sample, and for samples with the 1 nm $Bi_2O_3$ $V_T$ adjustment layer on top of the $HfO_2$ layer are shown in FIG. 4. As we used capacitors in this simplified experiment, we consider relative flatband voltage ($V_{FB}$) shift compared to the $HfO_2$ reference instead of $V_T$ shift. For the as-grown $Bi_2O_3$ $V_T$ adjustment layer, the shift in $V_{FB}$ is 0.7 V in the positive direction and for the 800 and 900° C. annealed samples the shift in $V_{FB}$ is still 0.5 V or larger. If such $V_{FB}$ shifts would occur in a transistor processed in a regular device flow with a metal electrode like TiN, it would bring the EWF to the Si valence band edge and hence $V_T$ to the low target value required for HP PMOS transistors. The $V_T$ adjustment layers are not deteriorating the CV curves, indicating that there is no negative impact on the $SiO_2/HfO_2$ interface quality. No severe EOT degradation was observed due to the addition of $Bi_2O_3$ $V_T$ adjustment layers.

Example 2

Figure 5:
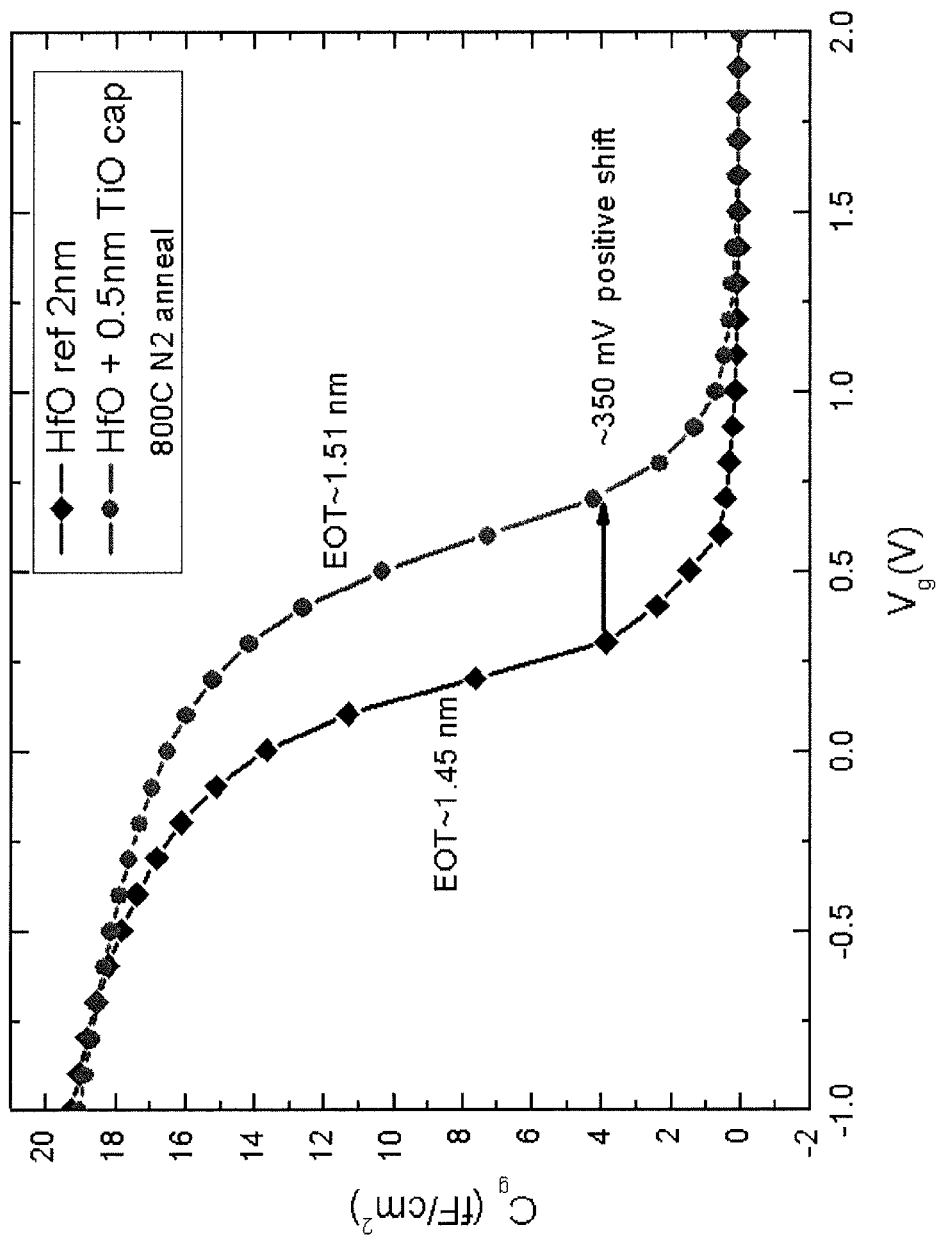
FIG. 5 shows CV curves for gate stacks having a $TiO_2$ $V_T$ adjustment layer.

On p-type silicon substrates first a ~1 nm $SiO_2$ interfacial layer was grown and then a 2 nm $HfO_2$ high-k gate dielectric layer was deposited with an ALD process using $HfCl_4$ and $H_2O$ chemistry. A 0.5 nm $TiO_2$ $V_T$ adjustment layer was deposited using an ALD process with $Ti(OCH_4)_3+H_2O$ chemistry. Alternative chemistries for the $TiO_2$ deposition can be used like $TiCl_4$, $Ti(OC_3H_7)_4$ and $(Me_5Cp)Ti(OMe)_3$. An anneal at 800° C. in $N_2$ for 10 minutes was performed. A top electrode of Pt was deposited by Physical Vapor Deposition. C-V curves for a $HfO_2$ reference sample, and for the samples with the 0.5 nm $TiO_2$ $V_T$ adjustment layer over the $HfO_2$ are shown in FIG. 5. The $TiO_2$ layer showed a $V_{FB}$ shift of about 0.35 V.

Example 3

For doping of the gate dielectric layer the following proposed processing sequence could be used: grow a ~1 nm $SiO_2$ interfacial layer on a silicon substrate and then deposit a 2 nm $HfO_2$ high-k gate dielectric layer with an ALD process using $HfCl_4$ and $H_2O$ chemistry; expose the $HfO_2$ gate dielectric to a fluorine containing gas; then deposit a top electrode. The conditions of the exposure to the fluorine containing gas are selected such that the EWF obtains a desired value.

Example 4

We propose the following experiment. A ~1 nm $SiO_2$ interfacial layer can be grown silicon substrates and then a 2 nm $HfO_2$ high-k gate dielectric layer can be deposited with an ALD process using $HfCl_4$ and $H_2O$ chemistry. Then a 1-10 nm thick $V_T$ adjustment layer containing Ge, Sb or Te in any composition thereof can be deposited over the high-k dielectric layer. The GeSbTe layer can be deposited with an ALD process using $GeCl_2.C_4H_8O_2$, $SbCl_3$ and $(Et_3Si)_2Te$ as precursors for respectively Ge, Sb or Te. The top electrode will be Pt, TaN, TiN or Al.

The experiments described in example 1 and 2 may not be fully representative of the situation in a full CMOS transistor device. In a transistor device a different metal electrode choice likely will be used and the gate stack might be subjected to different (higher or lower) temperatures and treatments than in these examples. The resulting EWF value of an actual gate stack after the process flow is determined by several convoluting effects: metal deposition technique, metal thickness, anneal conditions, intermixing of $V_T$ adjustment layer with host high-k dielectric, intermixing of host high-k dielectric with $SiO_2$ interfacial layer, diffusion of $V_T$ adjustment layer towards $SiO_2$ interfacial layer, etc. This means that obtaining the same (or even larger) shift of $V_{FB}$ or EWF as demonstrated in example 1 and 2, may depend on an optimal choice of metal electrode or other process steps used.

Although in the present disclosure the chemical formula's are used for Hafnium Oxide ($HfO_2$), Bismuth Oxide ($Bi_2O_3$) and Titanium Oxide ($TiO_2$), the actual oxides may deviate from the stoichiometric composition and are understood to be included in the present description.

The invention claimed is:

1. A method of fabricating a semiconductor device comprising a gate stack of a gate dielectric layer and a gate electrode, the method comprising the steps of:
    forming the gate dielectric layer over a semiconductor substrate, the gate dielectric layer being a first metal oxide or first semimetal oxide having a first electronegativity value;
    forming a dielectric $V_T$ adjustment layer over the gate dielectric layer, the dielectric $V_T$ adjustment layer being a second metal oxide or second semimetal oxide having a second electronegativity value; and
    forming the gate electrode over the gate dielectric layer and the dielectric $V_T$ adjustment layer;
    wherein an Effective Work Function value of said gate stack is a function of a thickness and composition of the dielectric $V_T$ adjustment layer, and
    wherein the second electronegativity value is higher than both the first electronegativity value and an electronegativity value of $Al_2O_3$.

2. The method of claim 1 wherein the second metal having the second electronegativity value is selected from the following: Ti, Mo, W, Pb, Sb, Bi and Ge.

3. The method of claim 2 wherein the second metal having the second electronegativity value is Ti.

4. The method of claim 2 wherein the second metal having the second electronegativity value is one of: Mo and W.

5. The method of claim 2 wherein the second metal having the second electronegativity value is Pb.

6. The method of claim 2 wherein the second metal having the second electronegativity value is one of: Sb and Bi.

7. The method of claim 2 wherein the second metal having the second electronegativity value is Ge.

8. The method of claim 1 wherein the second metal oxide is $Bi_2O_3$.

9. A method of fabricating a semiconductor device comprising a gate stack of a gate dielectric layer and a gate electrode, the method comprising the steps of:

forming the gate dielectric layer over PMOS regions of a semiconductor substrate, the gate dielectric layer having a first electronegativity value;

forming a dielectric $V_T$ adjustment layer containing Ge, Sb or Te in any composition thereof over the gate dielectric layer, the dielectric $V_T$ adjustment layer having a second electronegativity value; and forming the gate electrode over the gate dielectric layer and the dielectric $V_T$ adjustment layer;

wherein an Effective Work Function value of said gate stack is a function of a thickness and composition of the dielectric $V_T$ adjustment layer, and wherein the second electronegativity value is higher than both the first electronegativity value and an electronegativity value of $Al_2O_3$.

* * * * *

UNITED STATES PATENT AND TRADEMARK OFFICE
CERTIFICATE OF CORRECTION

PATENT NO. : 8,399,344 B2  Page 1 of 2
APPLICATION NO. : 12/898911
DATED : March 19, 2013
INVENTOR(S) : Dieter Pierreux et al.

It is certified that error appears in the above-identified patent and that said Letters Patent is hereby corrected as shown below:

In the Claims

Column 4, line 61 through Column 5, line 6, Claims 2-7:

"2. The method of claim 1 wherein the second metal having the second electronegativity value is selected from the following: Ti, Mo, W, Pb, Sb, Bi and Ge.

3. The method of claim 2 wherein the second metal having the second electronegativity value is Ti.

4. The method of claim 2 wherein the second metal having the second electronegativity value is one of: Mo and W.

5. The method of claim 2 wherein the second metal having the second electronegativity value is Pb.

6. The method of claim 2 wherein the second metal having the second electronegativity value is one of: Sb and Bi.

7. The method of claim 2 wherein the second metal having the second electronegativity value is Ge."

Should read:

--2. The method of claim 1 wherein a metal component of the second metal oxide or semi metal oxide having the second electronegativity value is selected from the following: Ti, Mo, W, Pb, Sb, Bi and Ge.

3. The method of claim 2 wherein the metal component is Ti.

Signed and Sealed this
Second Day of December, 2014

Michelle K. Lee
*Deputy Director of the United States Patent and Trademark Office*

4. The method of claim 2 wherein the metal component is one of: Mo and W.

5. The method of claim 2 wherein the metal component is Pb.

6. The method of claim 2 wherein the metal component is one of: Sb and Bi.

7. The method of claim 2 wherein the metal component is Ge.--